(12) United States Patent
Odnoblyudov

(10) Patent No.: US 10,230,035 B2
(45) Date of Patent: Mar. 12, 2019

(54) LIGHT EMITTING DIODE PACKAGE HAVING SERIES CONNECTED LEDS

(71) Applicant: Bridgelux, Inc., Livermore, CA (US)

(72) Inventor: Vladimir A. Odnoblyudov, Danville, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 15/853,413

(22) Filed: Dec. 22, 2017

(65) Prior Publication Data

US 2018/0123010 A1 May 3, 2018

Related U.S. Application Data

(62) Division of application No. 14/869,507, filed on Sep. 29, 2015, now Pat. No. 9,853,197.

(60) Provisional application No. 62/057,189, filed on Sep. 29, 2014.

(51) Int. Cl.
| | |
|---|---|
| H01L 21/00 | (2006.01) |
| H01L 33/62 | (2010.01) |
| H01L 25/075 | (2006.01) |
| H01L 33/50 | (2010.01) |
| H01L 33/64 | (2010.01) |

(52) U.S. Cl.
CPC .......... *H01L 33/62* (2013.01); *H01L 25/0753* (2013.01); *H01L 33/502* (2013.01); *H01L 33/64* (2013.01); *H01L 2224/48091* (2013.01); *H01L 2224/48137* (2013.01); *H01L 2924/181* (2013.01)

(58) Field of Classification Search
CPC . H01L 27/3253; H01L 25/0753; H01L 33/62; H01L 33/507
See application file for complete search history.

(56) References Cited

U.S. PATENT DOCUMENTS

| | | | |
|---|---|---|---|
| 6,885,035 B2 * | 4/2005 | Bhat | ................... H01L 25/0753 257/103 |
| 7,868,346 B2 | 1/2011 | Guo | |
| 8,193,015 B2 | 6/2012 | Horng | |
| (Continued) | | | |

OTHER PUBLICATIONS

Non-Final Office Action dated Jun. 23, 2016 in U.S. Appl. No. 14/869,507.

(Continued)

*Primary Examiner* — Kevin M Picardat
(74) *Attorney, Agent, or Firm* — Snell & Wilmer L.L.P.

(57) ABSTRACT

Light emitting diode packages as disclosed herein include a monolithic chip including at least a first and a second light emitting diode (LED) that are electrically coupled in series, wherein the first and the second LEDs each include at least one electrical terminal configured to be electrically coupled to a power source. The monolithic chip is mounted onto a connection substrate having first and second landing pads formed from metallic material and electrically isolated from each other. The monolithic chip is mounted to the connection substrate such that the electrical terminal of the first LED is electrically connected to the first landing pad and the electrical terminal of the second LED is electrically connected to the second landing pad. In an example, the monolithic chip includes a third and a fourth LED electrically coupled to each other in series, and electrically coupled to the first and second LEDs in parallel.

20 Claims, 4 Drawing Sheets

(56) References Cited

U.S. PATENT DOCUMENTS

| | | |
|---|---|---|
| 8,284,350 B2 | 10/2012 | Abe |
| 8,344,601 B2 | 1/2013 | Baek |
| 8,368,190 B2 | 2/2013 | Lee |
| 8,436,373 B2 | 5/2013 | Mizutani |
| 8,445,933 B2 | 5/2013 | Lee |
| 8,455,908 B2 | 6/2013 | Welch |
| 8,525,216 B2 | 9/2013 | Chen |
| 9,018,655 B2 | 4/2015 | Tu |
| 9,093,293 B2 | 7/2015 | Ibbetson |
| 9,368,548 B2 | 6/2016 | Lee |
| 9,673,363 B2 | 6/2017 | Abe |
| 9,853,197 B2 | 12/2017 | Obnoblyudov |
| 2006/0163589 A1 | 7/2006 | Fan |
| 2008/0121905 A1 | 5/2008 | Wu |
| 2009/0134422 A1 | 5/2009 | Sah |
| 2010/0006864 A1 | 1/2010 | Steigerwald |
| 2010/0163900 A1 | 7/2010 | Seo |
| 2011/0215349 A1 | 9/2011 | An |
| 2011/0254036 A1 | 10/2011 | Kim |
| 2012/0043563 A1 | 2/2012 | Ibbetson |
| 2012/0193661 A1 | 8/2012 | Emerson |
| 2013/0049038 A1 | 2/2013 | Jeong |
| 2013/0087817 A1 | 4/2013 | An |
| 2013/0341657 A1 | 12/2013 | Oyaizu |
| 2014/0153238 A1 | 6/2014 | Nishimura |
| 2014/0197433 A1 | 7/2014 | Ishizaki |
| 2014/0231832 A1* | 8/2014 | Lee .................. H01L 27/15 257/88 |
| 2014/0240974 A1 | 8/2014 | Hussell |
| 2014/0252384 A1 | 9/2014 | Xu |
| 2014/0362565 A1 | 12/2014 | Yao |
| 2015/0028754 A1 | 1/2015 | Siessegger |
| 2015/0077991 A1 | 3/2015 | Palfreyman |
| 2015/0123160 A1 | 5/2015 | Hsu |
| 2015/0311391 A1 | 10/2015 | Chen |
| 2015/0345714 A1 | 12/2015 | Reiherzer |
| 2015/0349218 A1* | 12/2015 | Reiherzer .............. H01L 33/56 257/88 |
| 2016/0013164 A1 | 1/2016 | Tudorica |
| 2016/0066382 A1 | 3/2016 | Odnoblyudov |
| 2016/0315228 A1 | 10/2016 | Chou |

OTHER PUBLICATIONS

Ex Parte Quayle dated Nov. 15, 2016 in U.S. Appl. No. 14/869,507.
Non-Final Office Action dated Mar. 15, 2017 in U.S. Appl. No. 14/869,507.
Notice of Allowance dated Aug. 18, 2017 in U.S. Appl. No. 14/869,507.

* cited by examiner

US 10,230,035 B2

LIGHT EMITTING DIODE PACKAGE HAVING SERIES CONNECTED LEDS

CROSS-REFERENCE TO RELATED APPLICATIONS

This patent application is a divisional of U.S. patent application Ser. No. 14/869,507 filed Sep. 29, 2015, now U.S. Pat. No. 9,853,197 issued Dec. 26, 2017, which claims the benefit of U.S. Provisional Patent Application No. 62/057,189 filed Sep. 29, 2014, which applications are hereby incorporated by reference in their entirety.

FIELD

Disclosed herein are light emitting diode array constructions, light emitting diode array packages comprising the same, and methods for making the same.

BACKGROUND

Light emitting diode (LED) packages for end-use lighting applications are known the art. FIG. 1 illustrates an example known LED package 10 comprising a single LED 12, which is a lateral or vertical LED, comprising a P contact 14 and an N contact 16 positioned along a top surface 18 of the LED and on an LED substrate 20, e.g., one that active material used to form the P and N junctions is epitaxially grown on. The LED 12 is disposed on a metal substrate 22 comprising P and N electrical terminals 24 and 26 that are separated from one another and held together by an electrically nonconductive material 28. The LED 12 is electrically connected with the metal substrate by wires 30 and 32 respectively extending from the LED P contact 14 and that is wired bonded to the metal substrate P terminal 24, and from the LED N contact 16 and that is wire bonded to the metal substrate N terminal 26. The LED may be encapsulated with a wavelength conversion material 34 to facilitate light emission from the LED in a particular wavelength.

Arrays of such known LEDs, e.g., two or more lateral or vertical LEDs, may be formed by interconnecting the P contact of one LED to an N contact of an adjacent LED in series by wires extending along the top surface of the LEDs. FIG. 2 illustrates an array 40 of known LEDs, e.g., a 3×3 array of lateral or vertical LEDS, wherein the LEDs 42 in the array are connected with in series to one another by wires 44 extending along the top surface between the P and N contacts of adjacent LEDs. The serially connected LEDs are then connected in parallel to the metal substrate by a wire 46 extending from the P contact of a first LED in the series to the P terminal 48 of the metal substrate, and a wire 50 extending from the N contact of a last LED in the series to the N terminal 52 of the metal substrate.

A feature of such known LED package is that they are costly to make given the time and labor associated with forming the wired connections from the LED to the metal substrate and, in an array configuration additionally with forming the wired serial electrical connections between the individual LEDs. Further, such LED packages are known to have less than optimal thermal properties, as the LED or LEDs in an array generate a large amount of heat when powered, which heat largely remains in the LED and is not efficiently extracted or removed therefrom during operation, thereby operating to reduce LED service life and reduce the service life of lighting devices or assemblies comprising the same.

It is, therefore, desired that LED package be constructed in a manner that is both cost efficient to make, and that has improved thermal performance properties when compared to such above-described LED constructions and packages.

BRIEF DESCRIPTION OF THE DRAWINGS

These and other features and advantages of light emitting diode constructions, assemblies comprising the same, and methods for making the same as disclosed herein will be appreciated as the same becomes better understood by reference to the following detailed description when considered in connection with the accompanying drawings.

SUMMARY

Light emitting diode packages as disclosed herein comprise a monolithic chip including at least a first and a second light emitting diode (LED) that are electrically coupled in series. The first and the second LEDs each include at least one electrical terminal configured to be electrically coupled to a power source. In an example embodiment, LEDs are flip chip LEDs and the electrical terminals extend along a common surface of the LEDs. The monolithic chip is mounted onto a connection substrate that includes first and second landing pads which are formed from a metallic material and that are electrically isolated from each other. In an example, the connection substrate includes a silicone material interposed between the first and second landing pads and extending around and edge of the connection substrate. The monolithic chip is mounted to the connection substrate such that the electrical terminal of the first LED is electrically connected to the first landing pad and the electrical terminal of the second LED is electrically connected to the second landing pad. In an example, the monolithic chip includes a third and a fourth LED electrically coupled to each other in series, and electrically coupled to the first and second LEDs in parallel. In such example, the first and second terminals operate to provide the parallel electrical connection between the LEDs.

LED packages as disclosed herein are made by the steps of forming a monolithic wafer comprising a number of LEDs. Forming a series electrical connection between LEDs that are oriented in a sting, and forming a parallel electrical connection between LEDs in the string, wherein the steps of forming the series and parallel electrical connections are done at the wafer level. In an example, the monolithic wafer may have two or more strings of serially connected LEDs, and the parallel electrical connection between LEDs in the two or more strings may be provided by first and second electrical terminals formed on the monolithic wafer. The so-formed wafer is then connected with the connection substrate so that the first and second electrical terminals are in contact with the connection substrate first and second landing pads to both provide an electrical connection therebetween, and to facilitate the transfer of heat or thermal energy from the monolithic wafer during operation of the LED package to thereby provide improved thermal operating efficiency and performance.

DETAILED DESCRIPTION

Light emitting diodes (LEDs) and packages comprising the same as disclosed herein are specially constructed having a flip chip architecture configured to promote use in an array and packaging with a metal connection substrate in a manner that is both cost efficient and that provides improved thermal properties when compared to the conventional LED packages discussed above.

Figure 1:
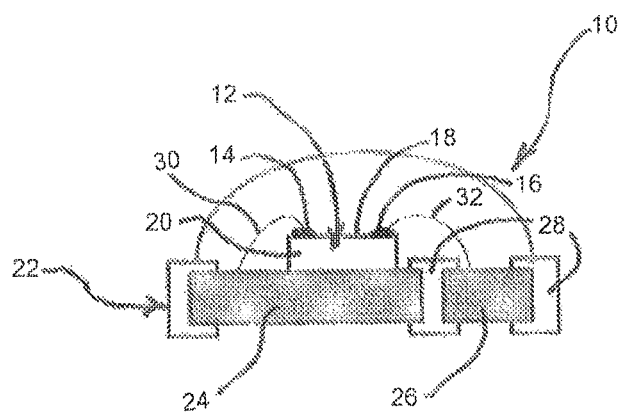
FIG. 1 is a cross-sectional side view of a known light emitting diode package.
Figure 2:
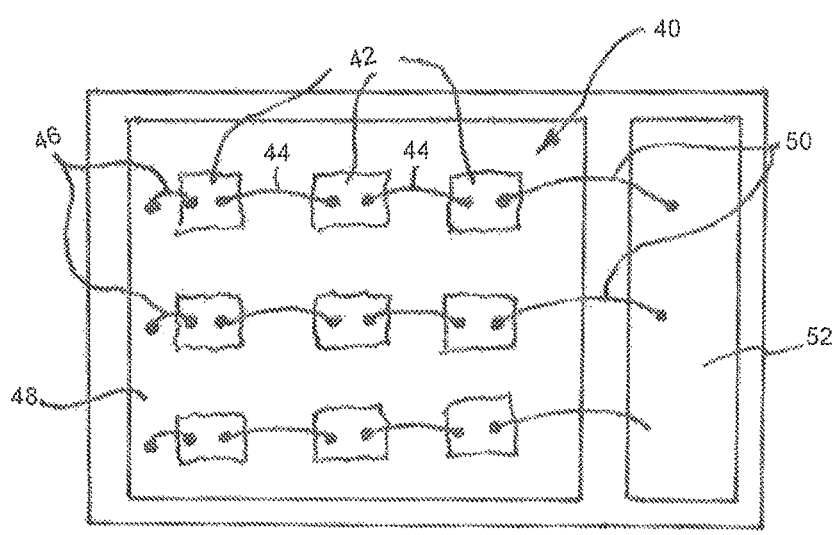
FIG. 2 is a top view of a known light emitting diode array package.
Figure 3:
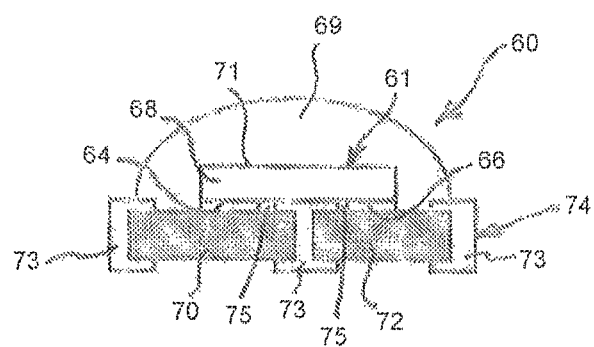
FIG. 3 is a cross-sectional side view of an example monolithic light emitting diode array package as disclosed herein.

FIG. 3 illustrates an LED package 60 as disclosed herein comprising a monolithic wafer or die 61 comprising one or more LEDs. In an example, the monolithic die may include a single LED and the LED may be a flip chip LED comprising P and N contacts 64 and 66 that are disposed along a common surface of the LED. In such embodiment, the LED comprises a transparent substrate 68 through which light is emitted upon powering the LED, wherein the P and N contacts are positioned along a surface of the LED opposite a top surface 71 of the transparent substrate 68. The flip chip LED may be formed by conventional technique, e.g., by epitaxially depositing a desired active material onto a compatible substrate material. In an example, the active material may be selected produce light in a blue wavelength in the range of from about 400 to 500 nm, herein referred to as a blue flip chip LED. In an example, the blue flip chip LED comprises an active material formed for example from GaN that has been grown, e.g., epitaxially grown, onto a transparent substrate such as one formed from sapphire or the like having a crystalline lattice structure that is compatible with the active material, e.g., GaN. This is but one example of the type of active material and substrate that can be used to form flip chip LEDs useful for forming LED packages as disclosed herein, and it is to be understood that such example is provided for references and that the types of flip chip LEDs within the scope of the concept as disclosed herein are not limited as to the types of active materials or substrates that may be used to form the same. The LED may be encapsulated with a wavelength converting material 69 such as conformal phosphor or the like for the purpose of converting the wavelength of light produce by the LED to a desired wavelength for an end-use application.

The LED P and/or N contacts 64 and 66 may be fanned out, or their respective surface area enlarged/expanded, so as to form P and/or N terminals to facilitate connection with respective P and N terminals or contact pads 70 and 72 of a connection substrate 74 used both to accommodate mechanical attachment of the LED and provide electrical power thereto. In an example, the LED P and N contacts or terminals 64 and 66 are sized to both facilitate a desired electrical contact with the respective connection substrate P and N terminals or contact pads 70 and 72, and to facilitate a desired level of heat or thermal transfer from the LED to the connection substrate to provide an improved level of thermal properties, improving the service life of the LEDs and the package comprising the same. In an example, the P and N terminals 70 and 72 of the connection substrate are formed from a metallic material such as copper or the like.

As illustrated in FIG. 3, the P and N terminals 70 and 72 of the connection substrate 74 are separated from one another by an electrically insulating material 73, which in an example embodiment may be a polymeric material such as silicone or the like. In an example, open spaces 75 may exist between the electrically insulating material 73 and the LED P and N contacts 64 and 66. An electrically insulating material 73 is also disposed along outer edges of the P and N terminals 70 and 72 and operates both to insulate the outer edges and to hold the P and N terminals together. In an example, the electrically insulating material disposed along the outer edges of the conductive substrate may be formed from the same material used to separate the P and N terminals. In an example, the connection substrate comprising the P and N terminals, the insulating material interposed therebetween, and the insulating material disposed around the edge of the P and N terminals, may be formed by a molding process.

Example LED packages as disclosed herein may comprise a single LED or a number of LEDs connected with the connection substrate. In an example where the LED package comprises a single LED, such LED comprises a single P contact and single N contact that is placed into contact with the respective P and N terminal of the connection substrate. In an example where the LED package comprises a number of LEDs, such LEDs may be provided in combined form as a monolithic wafer or die, wherein the monolithic wafer comprises a number of P and N contacts associated with each LED, and wherein the P and N contacts are disposed along a common wafer surface.

Figure 4:
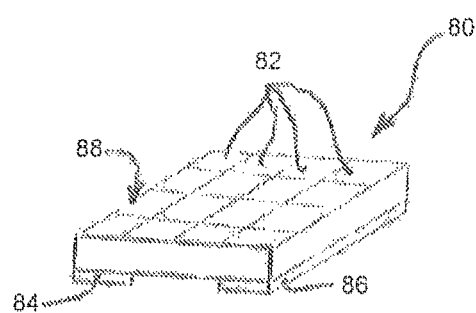
FIG. 4 is a perspective view of an example monolithic light emitting diode array as disclosed herein.

FIG. 4 illustrates a monolithic wafer 80 comprising an array of LEDs 82, and in an example embodiment the LEDs are flip chip LEDs. In the illustrated example, the monolithic wafer comprises a 4×4 array of LEDs or 16 LEDs. However, it is to be understood that the number and arrangement of LEDs in the monolithic wafer may be other than that disclosed and illustrated. For example, the monolithic wafer may comprise two or more LEDs that are oriented extending along a common axis, or may comprise two or more LEDs that are oriented along a first axis and a second axis perpendicular to the first axis, e.g., in an array where the LEDs in the array are in a series-parallel electrical connection. The particular number and arrangement of LEDs within the monolithic wafer is understood to vary depending on the particular end-use application.

In example illustrated in FIG. 4, the monolithic wafer 80 comprises P and N terminals 84 and 86 extending along a common surface of the wafer opposite the wafer substrate top surface 88. The P and N terminals extend in a direction parallel with one another and are in parallel electrical connection with respective P contacts of terminal LEDs positioned at one end of the array, and are in parallel electrical connection with respective N contacts of terminal LEDs positioned at an opposite end of the array. As described above, the P and N terminals 84 and 86 may be configured to provide both a desired degree of electrical contact with the connection substrate, and a desired degree of thermal transfer from the LED array to the connection substrate to thereby provide improved thermal performance properties during operation.

Figure 5:
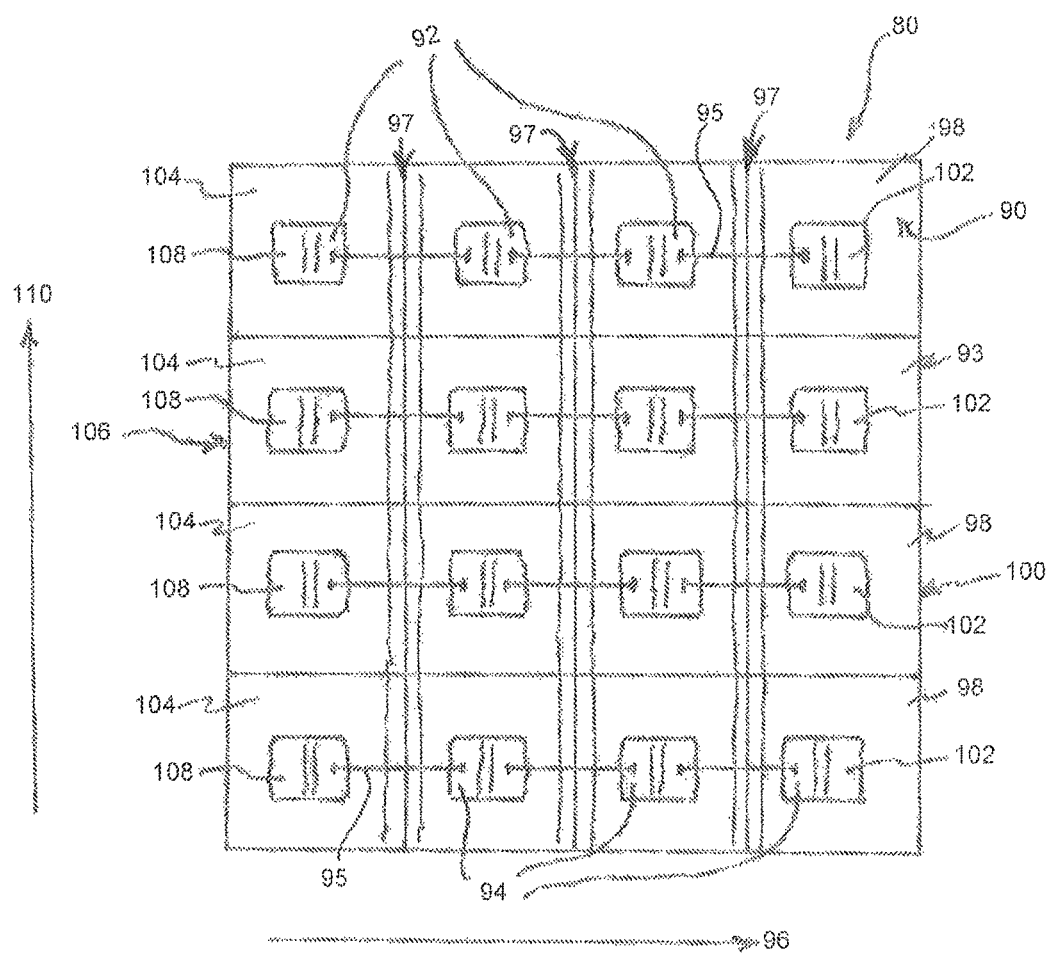
FIG. 5 is a bottom view of an example monolithic light emitting diode array as disclosed herein.

FIG. 5 illustrates an underside surface 90 of the monolithic wafer 80 of FIG. 4 prior to forming the P and N terminals (84 and 86 with reference to FIG. 4). A feature of LED packages as disclosed herein, comprising the use of a monolithic wafer having a number of LEDs, is the ability to provide a desired series and parallel electrical connection between the LEDs on the wafer itself, i.e., at the wafer level thereby avoiding the costs and labor associated with making such connections by wire bonding among individual LEDs, i.e., after the wafer has been diced to form the separate LEDs. In an example, a series electrical connection is made between the LEDs in each of the rows extending along a common first axis 96 by connecting P contacts 92 of an LED in each row with N contacts 94 of an adjacent LED in the same row. The series electrical connection between the P and N contacts within a row can be made by wire connection 95, by electrically conductive vias formed in the wafer, or by other electrically conductive element. In an example, the underside surface 90 may comprise recessed regions 97 extending along the wafer between adjacent LEDs in series connection. Again, a feature of the concept as disclosed herein is that such electrical connections between the LEDs are being done at the wafer level.

The array includes terminal LEDs 98 positioned at one end 100 of each row running along axis 96 that comprises a P contact 102, and includes terminal LEDs 104 positioned at an opposite end 106 of each row running along axis 96 that comprises an N contact 108. The LEDs in the rows running along axis 96, and that are in series electrical connection within the row, are placed into parallel electrical connection with each other by connecting together the P and N contacts 102 and 108 of the end LEDs 98 and 104, wherein the parallel connection extends along the axis 110, which is perpendicular to axis 96. Such parallel electrical connection can be made in the same manner as was done to provide the series electrical connection between the LEDs, e.g., by wire connection, electrically conductive vias formed in the wafer, or by other electrically conductive element, again all taking place at the wafer level. In an example, such parallel connection between the P and N contacts 102 and 108 is made by configuring such respective P and N contacts to connect with one another to form a respective P and N terminal (as illustrated in FIG. 4), e.g., by fanning out, enlarging or expanding the contact configurations. Alternatively, such parallel connection between the P and N contacts 102 and 108 can be made through the use of separate metallic electrodes that are configured to be attached with each of the respective P and N contacts 102 and 108, which electrodes thereby form the P and N terminals for the monolithic wafer. The monolithic array and/or the P and N terminals are configured in such a manner so that the P and N terminals do not make direct contact with respective N and P contacts of the LEDs in the array.

Figure 6:
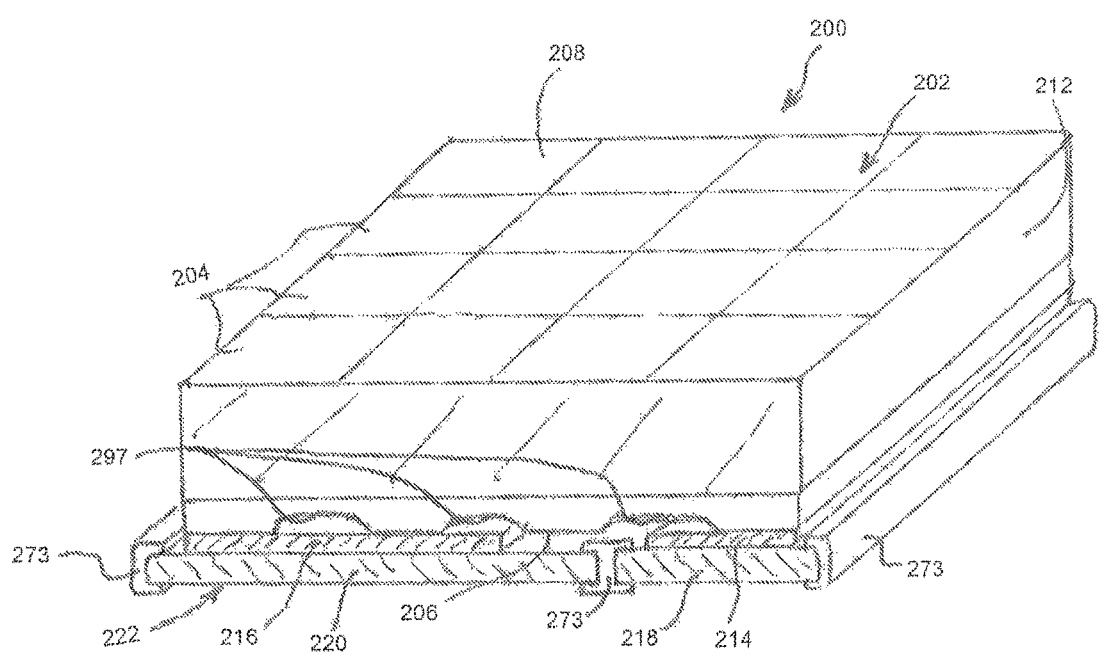
FIG. 6 is a perspective side view of an example monolithic light emitting diode array package as disclosed herein.

FIG. 6 illustrates an example LED package 200 as disclosed herein comprising monolithic wafer 202 as disclosed above with reference to FIGS. 4 and 5, comprising a plurality of LEDs 204, e.g., flip chip LEDs, forming an array that is in series-parallel electrical connection along a common surface 206 opposite a top surface 208 of the wafer, which is a top surface of a transparent substrate 212. The common surface 206 comprising recessed regions 297 (shown as 97 in FIG. 4). The monolithic wafer comprises a P terminal 214 and an N terminal 216 that are configured to provide a desired degree of electrical contact with respective P and N terminals or landing pads 218 and 220 of the connection substrate 222 to power the LED array, and to provide a desired degree of heat transfer from the LED array during operation. The connection substrate P and N landing pads 218 and 220 are separated from one another by the electrically insulating material 273, and the electrically insulating material 273 is also disposed along outer edges of the P and N landing pads 218 and 220 to insulate the outer edges of the LED package.

A feature of LED packages as disclosed herein is that the LEDs contained therein are provided in the form of a monolithic wafer and the electrical circuitry between the LEDs is formed at the wafer level, thereby reducing production costs. Further, LED packages as disclosed herein comprise flip chip LEDs having P and N terminals disposed along a common surface to facilitate attaching the monolithic LED array to respective P and N terminals or landing pads of a connection substrate wafer. The ability to physically connect the monolithic LED array to the connection substrate through the P and N terminals enables for the thermal transfer of heat from the LED array during operation, thereby providing improved thermal performance properties when compared to the conventional LED packages disclosed above.

Although certain specific embodiments of LED packages have been described and illustrated for purposes or reference, it is to be understood that the disclosure and illustrations as provided herein not limited to the specific embodiments. Accordingly, various modifications, adaptations, and combinations of various features of the described embodiments can be practiced without departing from the scope what has been disposed herein including the appended claims.

What is claimed is:

1. A method for making a light emitting diode (LED) package comprising the steps of:
   forming a monolithic wafer comprising a number of LEDs each having P and N contacts;
   forming two or more strings of two or more LEDs, wherein the two or more LEDs within each string have P and N contacts that are in series connection with one another;
   forming a parallel connection between the LEDs in the two or more strings by connecting together the P contacts of the LEDs existing only along one end of each string, and connecting together the N contacts of the LEDs existing only along an opposite end of each string, wherein the parallel P connection comprises a single P terminal extending from the monolithic wafer, and wherein the parallel N connection comprises a single N terminal extending from the monolithic wafer; and
   placing the monolithic wafer onto a connection substrate so that the P terminal is in contact with a P landing pad of the connection substrate and the N terminal is in contact with an N landing pad of the connection substrate, wherein the P and N landing pads are electrically isolated from one another.

2. The method as recited in claim 1 wherein the LEDs are flip chip LEDs, and wherein P and N terminals extend from a common surface of the monolithic wafer opposite from a transparent substrate of the monolithic wafer.

3. The method as recited in claim 1 wherein the N and P terminals and the N and P landing pads are all formed from a metallic material, and wherein before the step of placing, the connection substrate is formed comprising a silicone material interposed between the P and N landing pads.

4. The method as recited in claim 1 wherein before or after the step of placing, the connection substrate comprises an electrically isolating material disposed around an outside edge of the connection substrate.

5. The method as recited in claim 1 wherein the step of forming the two or more strings of LEDs and the step of forming a parallel connection takes place when the LEDs are in the form of the monolithic wafer.

6. The method as recited in claim 1 further comprising, after the step of placing, disposing a wavelength conversion material onto the monolithic wafer.

7. A method of making a monolithic wafer comprising an array of light emitting diodes (LEDs) in series-parallel electrical connection with one another, the method comprising the steps of:

electrically connecting two or more flip chip LEDs together in series to form a string of flip chip LEDs extending along the wafer, wherein the wafer comprises two or more of the strings of LEDs in series electrical connection and that extend along the wafer along a common first direction; and electrically connecting only first ends of the strings of the flip chip LEDs in parallel with one another by a single first electrical terminal at one end of the wafer, and electrically connecting only second ends of the strings of the flip chip LEDs in parallel by a single second electrical terminal at an opposite end of the wafer thereby forming series-parallel electrical connection between the LEDS.

8. The method as recited in claim 7 wherein the first electrical terminal is in parallel electrical contact with P contacts of the LED strings, and the second electrical terminal is in parallel electrical contact with N contacts of the LED strings.

9. The method as recited in claim 7 wherein one or more of the LEDs produces light in a wavelength of from about 400 to 500 nm.

10. The method as recited in claim 7 wherein one or more of the LEDs comprise an active material formed from GaN grown onto a transparent substrate.

11. The method as recited in claim 7 wherein the first and second electrical terminals are sized larger than electrical contacts of the respective LEDs that the first and second electrical terminals are connected with.

12. The method as recited in claim 7 wherein the strings of LEDs in series electrical connection with one another run along the wafer parallel to a first axis of direction, and wherein the LEDs connected in parallel run along the wafer parallel to a second axis of direction that is perpendicular to the first axis of direction.

13. The method as recited in claim 7 further comprising the step of connecting the LED array to connection substrate, wherein the connection substrate comprises first and second landing pads that are sized and positioned to make electrical contact with the respective first and second electrical terminals of the LED array.

14. The method as recited in claim 13, wherein before the step of connecting, the connection substrate is formed to include an electrically insulating material interposed between the first and second landing pads.

15. The method as recited in claim 13, wherein before or after the step of connecting, an electrically insulating material is disposed around an outside surface of the connection substrate.

16. A method of making a light emitting diode (LED) package comprising the steps of:

connecting a plurality of flip chip LEDs on a monolithic wafer in series-parallel electrical connection to form an LED array, wherein the LED array comprises a single first electrical terminal and a single second electrical terminal each in respective parallel connection with only LEDs at respective opposed ends of the strings of LEDs, wherein the LEDs within the strings are in series connection with one another; and connecting the LED array to a connection substrate, wherein the array first and second electrical terminals are in electrical contact with respective first and second landing pads of the connection substrate to form the LED package.

17. The method as recited in claim 16 wherein before the step of connecting the LED array to the connection substrate, the connection substrate is formed having an electrically insulating material interposed between the first and second landing pads.

18. The method as recited in claim 16 wherein before or after the step of connecting the LED array to the connection substrate, the connection substrate is formed having an electrically insulating material disposed along an outside edge of the connection substrate.

19. The method as recited in claim 16 wherein the strings of LEDs extend along the wafer in a direction parallel with a first axis, and the first and second electrical terminals extend along the wafer in a direction perpendicular to the first axis, and wherein the first and second electrical terminals are positioned along opposite ends of the wafer and LED array.

20. The method as recited in claim 16 wherein the first and second electrical terminals are sized larger than electrical contacts of the respective LEDs located at the opposed ends of the LED array that the first and second electrical terminals are connected with.

* * * * *